United States Patent
Kim et al.

(10) Patent No.: US 12,134,723 B2
(45) Date of Patent: *Nov. 5, 2024

(54) ETCHING COMPOSITION

(71) Applicant: ENF TECHNOLOGY CO., LTD., Gyeonggi-do (KR)

(72) Inventors: Tae Ho Kim, Gyeonggi-do (KR); Jeong Sik Oh, Gyeonggi-do (KR); Gi Young Kim, Gyeonggi-do (KR); Myung Ho Lee, Gyeonggi-do (KR); Myung Geun Song, Gyeonggi-do (KR)

(73) Assignee: ENF TECHNOLOGY CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/737,636

(22) Filed: May 5, 2022

(65) Prior Publication Data

US 2022/0380670 A1 Dec. 1, 2022

(30) Foreign Application Priority Data

May 25, 2021 (KR) .......................... 10-2021-0066895

(51) Int. Cl.
| | | |
|---|---|---|
| *C09K 13/08* | (2006.01) | |
| *C01B 33/20* | (2006.01) | |
| *C07F 7/08* | (2006.01) | |
| *H01L 21/4757* | (2006.01) | |

(52) U.S. Cl.
CPC .............. *C09K 13/08* (2013.01); *C01B 33/20* (2013.01); *C07F 7/0805* (2013.01); *H01L 21/47573* (2013.01)

(58) Field of Classification Search
None
See application file for complete search history.

(56) References Cited

U.S. PATENT DOCUMENTS

| | | | |
|---|---|---|---|
| 2012/0231632 A1* | 9/2012 | Takahashi | H01L 21/32134 252/79.4 |
| 2014/0073140 A1* | 3/2014 | Takahashi | H01L 21/823871 252/79.4 |
| 2019/0194580 A1* | 6/2019 | Kamimura | C11D 3/3418 |
| 2019/0276778 A1* | 9/2019 | Kim | H01L 21/31111 |
| 2020/0199764 A1* | 6/2020 | Renaud | C23F 11/04 |

FOREIGN PATENT DOCUMENTS

| | | | | |
|---|---|---|---|---|
| CN | 109609129 B | * | 2/2021 | ............. C09K 13/08 |
| WO | WO-2021076676 A1 | * | 4/2021 | ............. C09K 13/04 |

OTHER PUBLICATIONS

Machine English translation of CN-109609129-B; Li et al; Feb. 2, 2021 (Year: 2021).*

* cited by examiner

*Primary Examiner* — Shamim Ahmed
(74) *Attorney, Agent, or Firm* — Christensen, Fonder, Dardi PLLC; Diane E. Bennett; Peter S. Dardi

(57) ABSTRACT

Silicon etching compositions are described and may be used for selectively etching silicon with respect to a silicon insulating film. In particular, the silicon etching compositions can be used to improve the selective etching ratio of silicon from the surface of a semiconductor on which a silicone oxide film and silicon are exposed.

16 Claims, No Drawings

ETCHING COMPOSITION

This application claim priority to Korean Patent Application No. 10-2021-0066895, filed May 25, 2021, incorporated herein by reference.

TECHNICAL FIELD

The present invention relates to a silicon etching composition, and to a composition for selectively etching a silicon film with respect to a silicon insulating film.

BACKGROUND ART

A silicon oxide film ($SiO_2$) and a silicon nitride film (SiN) represent as insulating films in semiconductors. However, with an acid etchant of silicon containing etching species (typically hydrofluoric acid) and oxidizing species (typically nitric acid, sulfuric acid, etc.), its low selectivity with the $SiO_2$ film results in etching the insulating film in the bulk etching of silicon (Si), thereby causing defects such as exposure of the lower pattern and short circuit.

In particular, there is a risk of damaging the lower metal layer exposed by the non-selective etching of the insulating films ($SiO_2$, SiN), thereby causing defects in subsequent processes.

This problem with acidic etchants is a limiting factor in the application of acidic etchants in processes such as wafer thinning, semiconductor packaging, and Through-Silicon Via (TSV) due to low non-selective etching of $Si/SiO_2$.

Therefore, there is a need for research on an etchant that has a very low etch rate for silicon insulating films, particularly silicon oxide films and is capable of selectively etching silicon.

DETAILED DESCRIPTION OF THE INVENTION

Technical Problem

It is an object of the present invention to provide an etching composition having the improved etching selectivity of silicon with respect to silicon insulating film.

Solution to Problem

In order to solve the above problems, the present invention provides an etching composition comprising:
a fluorine compound;
sulfuric acid;
nitrosylsulfuric acid; and
a silicon compound.

According to one embodiment, the fluorine compound may comprise one or more of hydrofluoric acid, ammonium bifluoride, sodium fluoride, potassium fluoride, aluminum fluoride, fluoroboric acid, ammonium fluoride, sodium bifluoride, potassium bifluoride, and ammonium tetrafluoroborate.

According to one embodiment, the silicon compound may have 1 or 2 Si in the molecule. In addition, the silicon compound may comprise a compound represented by formula 1, formula 2, or formula 3.

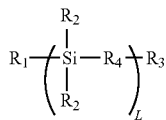

[Formula 1]

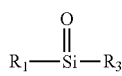

[Formula 2]

In the formula 1 and formula 2,
$R_1$ to $R_3$ are each independently hydrogen, a hydroxyl group, a cyano group, a substituted or unsubstituted $C_{1-10}$ alkyl group, a $C_{2-10}$ alkenyl group, a $C_{1-10}$ aminoalkyl group, a $C_{1-10}$ alkoxy group, or a halogen element, wherein the alkyl group is linear, branched or cyclic, with or without a halogen element or a substituent of $CH_3$;
$R_4$ is a single bond, a substituted or unsubstituted $C_{1-10}$ alkyl group, a $C_{2-10}$ alkenyl group, a $C_{1-10}$ aminoalkyl group, or a $C_{1-10}$ alkoxy group, wherein the alkyl group is linear, branched or cyclic, with or without a halogen element or a substituent of $CH_3$; and
L is 1 or 2.

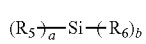

[Formula 3]

In the formula 3,
$R_5$ is ammonium;
$R_6$ is a halogen element;
a is 2; and
b is 6.

Specifically, the silicon compound may comprise one or more of silicic acid, ammonium hexafluorosilicate, dichloro dimethyl silane, methyl trichloro silane, silicon tetrachloride, chloro(methyl)phenylsilane, chloro-dimethyl(3,3,3-trifluoropropyl)silane, chloro(dimethyl)thexylsilane, chloro(dimethyl)vinylsilane, trichlorosilane, dichlorosilane, monochlorosilane, hexachlorodisilane, and pentachlorodisilane.

According to one embodiment, the composition of the present invention may further comprise an inorganic acid or a salt thereof, wherein the inorganic acid or a salt thereof is not a fluorine compound, sulfuric acid, or a silicon compound. In addition, specifically, the inorganic acid may comprise one or more of nitric acid, phosphoric acid, and hydrochloric acid.

According to one embodiment, the etching composition of the present invention may have an etching selectivity of silicon to silicon oxide film of 60 or more.

According to other embodiment of the present invention, there is provided a method for preparing an etching composition, comprising mixing:
0.3 to 30% by weight of a fluorine compound,
50 to 95% by weight of sulfuric acid,
1 to 30% by weight of nitrosylsulfuric acid,
0.01 to 5% by weight of a silicon compound, and
the balance of water to make 100% by weight of the total weight of composition.

According to one embodiment, the method of the present invention may further comprise adding 0.1 to 10% by weight of an inorganic acid or a salt thereof, wherein the inorganic acid or a salt thereof is not a fluorine compound, sulfuric acid, or a silicon compound.

The specific details of other embodiments according to the present invention are included in the detailed description below.

Effect of the Invention

The etching composition according to the present invention can improve the selective etching ratio of silicon from the surface of the semiconductor on which a silicone oxide film and silicon are exposed.

BEST MODE FOR CARRYING OUT THE INVENTION

Since various modifications and variations can be made in the present invention, particular embodiments are illustrated in the drawings and will be described in detail in the detailed description. It should be understood, however, that the invention is not intended to be limited to the particular embodiments, but includes all modifications, equivalents, and alternatives falling within the spirit and scope of the invention. In the following description of the present invention, detailed description of known functions will be omitted if it is determined that it may obscure the gist of the present invention.

Unless otherwise specified in the present specification, the expression "~ to ~" to is used as an expression including the corresponding numerical value. Specifically, for example, the expression "1 to 2" is meant to include all numbers between 1 and 2 as well as 1 and 2.

In a semiconductor, silicon is oxidized to a silicon oxide film by an oxidizing species generated from an oxidizing agent and an auxiliary oxidizing agent. In addition, the silicon oxide film is etched in contact with the etchant. In particular, it is noted that silicon is oxidized to a silicon oxide film and the film that must have selectivity is also a silicon oxide film.

In the present invention, it was attempted to improve the selective etching effect of silicon (Si) by providing a specific combination of oxidizing agents.

Hereinafter, the etching composition according to an embodiment of the present invention will be described in more detail.

The etching composition of the present invention relates to an acidic etchant that selectively etches only silicon from a semiconductor surface on which a silicon insulating film and silicon are simultaneously exposed. Specifically, there is provided an etching composition of silicon having excellent selectivity with respect to a silicon oxide film ($SiO_2$) and a silicon nitride film (SiN), which are representative insulating films.

The present invention provides an etching composition comprising:
a fluorine compound;
sulfuric acid;
nitrosylsulfuric acid; and
a silicon compound.

According to one embodiment, the fluorine compound, which is a compound that dissociates to generate $F^-$ or $HF^{2-}$ having strong affinity with silicon, serves to etch the silicon oxide film. The fluorine compound may comprise one or more of hydrofluoric acid (HF), ammonium bifluoride (ABF, $NH_4HF_2$), sodium fluoride (NaF), potassium fluoride (KF), aluminum fluoride ($AlF_3$), fluoroboric acid ($HBF_4$), ammonium fluoride ($NH_4F$), sodium bifluoride ($NaHF_2$), potassium bifluoride ($KHF_2$) and ammonium tetrafluoroborate ($NH_4BF_4$). Specifically, for example, it may comprise one or more of hydrofluoric acid, ammonium fluoride, and ammonium bifluoride.

The content of the fluorine compound may be 0.3 to 30% by weight, for example 1 to 20% by weight, for example 1 to 10% by weight, for example 1 to 5% by weight. Within this content range, it is suitable for etching a silicon film with respect to a silicon insulating film.

According to one embodiment, the composition of the present invention may contain 50 to 95% by weight of sulfuric acid, for example, 60 to 95% by weight, for example, 70 to 90% by weight, for example 75 to 90% by weight of sulfuric acid. Within the content range as described above, sulfuric acid serves to oxidize silicon.

According to one embodiment, the composition of the present invention may contain 1 to 30% by weight of nitrosylsulfuric acid, for example, 1 to 20% by weight, for example, 2 to 15% by weight of nitrosylsulfuric acid. Within this content range as described above, nitrosylsulfuric acid serves as a catalyst for silicon oxidation.

In particular, the present invention can effectively oxidize silicon by including both sulfuric acid and nitrosylsulfuric acid separately.

The present invention can increase a selective etching rate of silicon by including a specific concentration of a specific oxidizing species as described above.

According to one embodiment, the silicon compound of the present invention may be added as an additive for controlling the $Si/SiO_2$ selectivity. For example, a silicon compound may have 1 or 2 Si in the molecule. In addition, the silicon compound may comprise a compound represented by formula 1, formula 2, or formula 3.

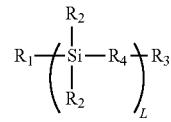
[Formula 1]

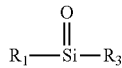
[Formula 2]

In the formula 1 and formula 2,
$R_1$ to $R_3$ are each independently hydrogen, a hydroxyl group, a cyano group, a substituted or unsubstituted $C_{1-10}$ alkyl group, a $C_{2-10}$ alkenyl group, a $C_{1-10}$ aminoalkyl group, a $C_{1-10}$ alkoxy group, or a halogen element, wherein the alkyl group is linear, branched or cyclic, with or without a halogen element or a substituent of $CH_3$;
$R_4$ is a single bond, a substituted or unsubstituted $C_{1-10}$ alkyl group, a $C_{2-10}$ alkenyl group, a $C_{1-10}$ aminoalkyl group, or a $C_{1-10}$ alkoxy group, wherein the alkyl group is linear, branched or cyclic, with or without a halogen element or a substituent of $CH_3$; and
L is 1 or 2.

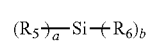
[Formula 3]

In the formula 3,
$R_5$ is ammonium;
$R_6$ is a halogen element;
a is 2; and
b is 6.

The formula 3 is in the form of a halogenated silicate.

The halogen elements in the formula 1 or 3 are F, Cl, Br or I, for example.

Specifically, for example, the silicon compound of the present invention may comprise one or more of silicic acid, ammonium hexafluoro silicate (AHF), dichloro dimethyl silane (DCMS), methyl trichloro silane (MTCS), silicon tetrachloride, chloro(methyl)phenylsilane, chloro-dimethyl (3,3,3-trifluoropropyl)silane, chloro(dimethyl)thexylsilane, chloro(dimethyl)vinylsilane, trichlorosilane, dichlorosilane, monochlorosilane, hexachlorodisilane and pentachlorodisilane.

Silicic acid includes orthosilicic acid ($H_4SiO_4$), metasilicic acid ($H_2SiO_3$), mesodisilicate ($H_2Si_2O_5$), mesotrisilicic acid ($H_2Si_3O_3$), mesotetrasilicic acid ($H_6Si_4O_{11}$), pyrosilicic acid ($H_6O_7Si_2$). Specifically, the silicic acid, if present, in the present invention may comprise metasilicic acid (($OH)_2SiO$), for example.

The content of the silicon compound may be 0.01 to 5% by weight, for example, 0.01 to 3% by weight, for example, 0.01 to 2% by weight, for example, 0.1 to 1% by weight.

$SiO_2$ by CVD (=TEOS) has a high density and a large number of Si—OH adsorption sites compared to a silicon oxide ($SiO_2$) film which is oxidized by an oxidizing agent included in the etchant. When the silicon compound of the present invention serves as an additive for improving $Si/SiO_2$ selectivity, a number of additive molecules for improving selectivity can undergo chemisorption on the surface of $SiO_2$ by CVD (=TEOS), resulting in reducing the $SiO_2$ etch rate selectively and control the $Si/SiO_2$ selectivity effectively.

Further, fluorosilane-based, chlorosilane-based, and silanol-based silicon compounds are reacting with some water contained in the etchant and hydrolyzed to exist in the etchant as an additive which is capable of chemisorption with a chlorine (Cl) source, which is an oxidizing agent for Si. According to this mechanism, with only one kind of additive it is possible to increase Si etch rate and also decrease $SiO_2$ etch rate. Specifically, for example, a chlorosilane-based silicon compound is used to etch Si effectively.

According to one embodiment, the present invention may further comprise an inorganic acid or a salt thereof. The inorganic acid or a salt thereof may act to more effectively etch the silicon film by activating fluorine ions. It acts as an auxiliary oxidation catalyst of silicon and generates oxidizing species. The inorganic acid of the present invention does not comprise a fluorine compound, sulfuric acid, and a silicon compound, and specifically, for example, it may comprise one or more of nitric acid, phosphoric acid, and hydrochloric acid, and, for example, nitric acid.

The content of the inorganic acid or a salt thereof may be 0.1 to 10% by weight, for example, 0.1 to 5% by weight, for example, 0.5 to 5% by weight. Within this content range, it can promote the oxidation of silicon auxiliary.

According to one embodiment, the amount of water to make 100% by weight of the total weight of composition may be included. The water used is not particularly limited, but deionized water may be used. Preferably, deionized water having 18 MΩ/cm or more of a specific resistance value indicating the degree of removal of ions in the water, may be used.

According to one embodiment, the etching composition of the present invention may have the etching selectivity of silicon to the silicon oxide film of 60 or more, for example, 65 or more, for example, 1000 or less, and 500 or less, 300 or less, and 200 or less. The etching selectivity means a ratio of the etch rate of silicon with respect to the etch rate of the silicon insulating film.

According to one embodiment, the etching composition of the present invention may further comprise any additives used in a conventional etchant composition in order to improve etching performance. For example, it may further comprise one or more selected from the group consisting of stabilizers, surfactants, chelating agents, antioxidants, corrosion inhibitors, and mixtures thereof.

The stabilizer may be an etching stabilizer and may be added in order to suppress the generation of side reactions or byproducts that may be accompanied by unnecessary reactions of the etching composition or the object to be etched object.

The surfactant may be additionally added for the purpose of improving wettability of the etching composition, improving foam properties of the additive, and increasing solubility of other organic additives. The surfactant may be 1 or 2 or more selected from nonionic surfactants, anionic surfactants, cationic surfactants, and amphoteric surfactants, and may be added in an amount of 0.0005 to 5% by weight based on the total weight of the etchant, preferably 0.001 to 2% by weight based on the total weight of the etchant. When the content of the surfactant is less than 0.0005% by weight based on the total weight of the etchant, no effect can be expected, and when the content of the surfactant exceeds 5% by weight, solubility problems may occur or problems in the process may occur due to excessive foaming.

The chelating agent may be additionally added for the purpose of increasing the solubility of metal impurities of the etching composition or forming a uniform etched surface. The chelating agent may be added in an amount of 0.1 to 5% by weight based on the total weight of the etchant, and may preferably be an organic acid having a carboxyl group and a hydroxyl group at the same time.

The antioxidant and the corrosion inhibitor may be added in order to protect metals or metal compounds used as materials for semiconductor devices. The antioxidant and corrosion inhibitor may be used without limitation as long as they are commonly used in the art, for example, may include, but not limited to, an azole-based compound and may be added in an amount of 0.01 to 10% by weight based on the total weight of the etchant.

The etching method using the etching composition of the present invention may be performed according to a conventional method, and is not particularly limited.

Hereinafter, embodiments of the present invention will be described in detail so that those of ordinary skill in the art can easily carry out the present invention. However, the present invention may be embodied in several different forms and is not limited to the embodiments described herein.

EXAMPLES

Etching compositions were prepared with a composition according to Table 1, respectively, and etch rates for a silicon film (Si) and a silicon oxide film ($SiO_2$) were evaluated.

Each composition contains an amount of water to make 100% by weight of the total weight of the composition.

To determine the etch rate, the substrates to be evaluated on which each silicon oxide film was formed were cut to 20×20 mm, and the thickness and weight of each substrate were measured. The etching process was performed by introducing the etching composition according to each Example and Comparative Example into a thermostat maintained at 25° C. and immersing the wafer therein for 15 minutes. After completion of etching, the substrate was washed with ultrapure water and then the remaining etching composition and moisture were completely dried using a drying device. Thereafter, the weight of the dried substrate was measured, the weight change before and after evaluation was calculated, and the etch rate was measured according to Equation 1 below.

$$\text{(Initial substrate thickness} \times \text{Weight reduction rate)} / \text{Processing time} = \text{Etch rate} \quad [\text{Equation 1}]$$

TABLE 1

| | Content (wt %) | | | | | | | | Etch rate (Å/min) | | Selectivity |
|---|---|---|---|---|---|---|---|---|---|---|---|
| | Fluoric acid (HF) | ABF | Sulfuric acid | Nitrosyl sulfuric acid (NOHSO$_4$) | Inorganic acid or a salt thereof | | Additive | | Si | SiO$_2$ | Si/SiO$_2$ |
| Example 1 | | 3.6 | 81.1 | 10 | | | Silicic Acid | 0.3 | 6261 | 90 | 69 |
| Example 2 | | 3.6 | 80.8 | 10 | | | AHF | 0.6 | 6196 | 86 | 72 |
| Example 3 | | 3.6 | 81.1 | 10 | | | DCMS | 0.3 | 7926 | 66 | 120 |
| Example 4 | | 3.6 | 81.1 | 10 | | | MTCS | 0.3 | 8166 | 58 | 141 |
| Example 5 | | 3.6 | 81.0 | 10 | | | SiCl$_4$ | 0.4 | 8314 | 52 | 160 |
| Example 6 | 3 | | 81.1 | 10 | | | Silicic Acid | 0.3 | 7211 | 93 | 78 |
| Example 7 | 3 | | 80.8 | 10 | | | AHF | 0.6 | 7092 | 87 | 82 |
| Example 8 | 3 | | 81.1 | 10 | | | DCMS | 0.3 | 8722 | 72 | 121 |
| Example 9 | | 3.6 | 79.7 | 10 | Nitric acid | 1 | Silicic Acid | 0.3 | 13121 | 129 | 102 |
| Example 10 | | 3.6 | 79.4 | 10 | Nitric acid | 1 | AHF | 0.6 | 12992 | 122 | 106 |
| Example 11 | | 3.6 | 79.7 | 10 | Nitric acid | 1 | DCMS | 0.3 | 13210 | 91 | 145 |
| Example 12 | | 3.6 | 79.7 | 10 | Nitric acid | 1 | MTCS | 0.3 | 13609 | 82 | 166 |
| Example 13 | | 3.6 | 79.6 | 10 | Nitric acid | 1 | SiCl$_4$ | 0.4 | 13523 | 76 | 178 |

ABF: Ammonium bifluoride
Silicic acid: (OH)$_2$SiO
AHF: Ammonium hexafluoro silicate
DCMS: Dichloro dimethyl silane
MTCS: Methyl trichloro silane Comparative Examples Etching compositions were prepared with a composition according to Table 2, respectively, and etch rates for a silicon film (Si) and a silicon oxide film (SiO$_2$) were evaluated under same condition and in the same manner as in Example.

Each composition contains an amount of water to make 100% by weight of the total weight of the composition.

TABLE 2

| | Content (wt %) | | | | | | | Etch rate (Å/min) | | Selectivity |
|---|---|---|---|---|---|---|---|---|---|---|
| | Fluoric acid (HF) | ABF | Nitric acid | Phosphoric acid | Acetic acid | Sulfuric acid | Nitrosyl sulfuric acid (NOHSO$_4$) | Si | SiO$_2$ | Si/SiO$_2$ |
| Comparative Example 1 | 8.4 | | 20.0 | 10.0 | 44.0 | | | 5300 | 2340 | 2 |
| Comparative Example 2 | 1.2 | | 40.0 | 10.0 | 29.0 | | | 5200 | 710 | 7 |
| Comparative Example 3 | 0.5 | | 61.0 | 10.0 | | | | 6000 | 430 | 14 |
| Comparative Example 4 | 0.4 | | 69.4 | | | | | 4500 | 340 | 13 |
| Comparative Example 5 | 3.0 | | | | | 84.7 | 5.0 | 4708 | 114 | 41 |

TABLE 2-continued

| | Content (wt %) | | | | | | Etch rate (Å/min) | | Selectivity |
|---|---|---|---|---|---|---|---|---|---|
| | Fluoric acid (HF) | ABF | Nitric acid | Phosphoric acid | Acetic acid | Sulfuric acid | Nitrosyl sulfuric acid (NOHSO$_4$) | Si | SiO$_2$ | Si/SiO$_2$ |
| Comparative Example 6 | 3.0 | | | | | 82.0 | 10.0 | 4482 | 78 | 57 |
| Comparative Example 7 | 3.6 | | | | | 81.4 | 10.0 | 6309 | 114 | 55 |

ABF: Ammonium bifluoride

As shown in Tables 1 and 2, it was found that all of the etchants according to Examples had an etch rate of 6,000 Å/min or more and at the same time had an excellent selectivity of 60 or more.

On the other hand, it was found that Comparative Examples had selectivity of 60 or less and low etch rate of silicon. In particular, in the case of Comparative Example 6, although the etch rate is close to 60, it is confirmed that the etch effect of silicon is lower than that of Example as the etch rate of silicon is about 4,000 Å/min.

As described above, the etching composition according to the present invention improves the etch rate of silicon and at the same time improves the etching selectivity of silicon with respect to silicon insulating film.

As the specific parts of the present invention have been described in detail above, it is clear that these specific techniques are only preferred embodiment and the scope of the present invention is not limited thereto for those of ordinary skill in the art to which the present invention pertains. Those of ordinary skill in the art to which the present invention pertains will be able to make various applications and modifications within the scope of the present invention based on the above contents. Accordingly, the substantial scope of the present invention will be defined by the appended claims and their equivalents.

What is claimed is:

1. An etching composition comprising:
a fluorine compound;
sulfuric acid;
nitrosylsulfuric acid; and
a silicon compound,
wherein the silicon compound comprises a compound represented by formula 1, formula 2, or formula 3, or a combination thereof:

[Formula 1]

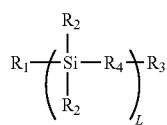

[Formula 2]

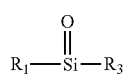

wherein, in the formula 1 and formula 2,
R$_1$ to R$_3$ are each independently hydrogen, a hydroxyl group, a cyano group, a substituted or unsubstituted C$_{1-10}$ alkyl group, a C$_{2-10}$ alkenyl group, a C$_{1-10}$ aminoalkyl group, a C$_{1-10}$ alkoxy group, or a halogen element, wherein the alkyl group is linear, branched or cyclic, with or without a halogen element or a substituent of CH$_3$;
R$_4$ is a single bond, a substituted or unsubstituted C$_{1-10}$ alkyl group, a C$_{2-10}$ alkenyl group, a C$_{1-10}$ aminoalkyl group, or a C$_{1-10}$ alkoxy group, wherein the alkyl group is linear, branched or cyclic, with or without a halogen element or a substituent of CH$_3$; and
L is 1 or 2,
[Formula 3]

$$(R_5)_a-Si-(R_6)_b$$ [Formula 3]

wherein in the formula 3,
R$_5$ is ammonium;
R$_6$ is a halogen element;
a is 2; and
b is 6, and
wherein the composition comprises at least 85% by weight of a combination of sulfuric acid and nitrosylsulfuric acid.

2. The etching composition according to claim 1, wherein the fluorine compound comprises one or more of hydrofluoric acid, ammonium bifluoride, sodium fluoride, potassium fluoride, aluminum fluoride, fluoroboric acid, ammonium fluoride, sodium bifluoride, potassium bifluoride, and ammonium tetrafluoroborate.

3. The etching composition according to claim 1, wherein the silicon compound has 1 or 2 Si in the molecule.

4. The etching composition according to claim 1, wherein the silicon compound comprises one or more of metasilicic acid, ammonium hexafluorosilicate, dichloro dimethyl silane, methyl trichloro silane, silicon tetrachloride, chloro (methyl)phenylsilane, chloro-dimethyl(3,3,3-trifluoropropyl)silane, chloro(dimethyl)hexylcaine, chloro(dimethyl)vinylsilane, trichlorosilane, dichlorosilane, monochlorosilane, hexachlorodisilane and pentachlorodisilane.

5. The etching composition according to claim 1, further comprising an inorganic acid or a salt thereof,
wherein the inorganic acid or a salt thereof is not a fluorine compound, sulfuric acid, or a silicon compound.

6. The etching composition according to claim 5, wherein the inorganic acid comprises one or more of nitric acid, phosphoric acid, and hydrochloric acid.

7. The etching composition according to claim 1, wherein the etching selectivity of silicon to silicon oxide is 60 or more.

8. The etching composition according to claim 1 wherein the composition selectively etches silicon relative to silicon oxide.

9. The etching composition of claim 1, wherein the composition comprises from about 0.3 to about 30% by weight of the fluorine compound, from about 50 to about 95% by weight of sulfuric acid, from about 1 to about 30% by weight of nitrosylsulfuric acid, and from about 0.01 to about 5% by weight of the silicon compound.

10. The etching composition according to claim 1, further comprising water.

11. The etching composition according to claim 1, wherein the etching selectivity of silicon to silicon oxide is from about 65 to about 500.

12. The etching composition according to claim 1, wherein the silicon compound comprises a compound represented by formula 1.

13. The etching composition according to claim 1, wherein the silicon compound comprises a compound represented by formula 2.

14. The etching composition according to claim 1, wherein the silicon compound comprises a compound represented by formula 3.

15. A method for preparing an etching composition, comprising mixing:
 0.3 to 30% by weight of a fluorine compound,
 50 to 95% by weight of sulfuric acid,
 1 to 30% by weight of nitrosylsulfuric acid,
 0.01 to 5% by weight of a silicon compound, and
 the balance of water to make 100% by weight of the total weight of the etching composition,
 wherein the silicon compound comprises a compound represented by formula 1, formula 2, or formula 3, or a combination thereof:

[Formula 1]

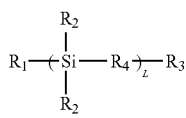

[Formula 2]

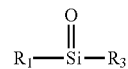

wherein, in the formula 1 and formula 2,
$R_1$ to $R_3$ are each independently hydrogen, a hydroxyl group, a cyano group, a substituted or unsubstituted $C_{1-10}$ alkyl group, a $C_{2-10}$ alkenyl group, a $C_{1-10}$ aminoalkyl group, a $C_{1-10}$ alkoxy group, or a halogen element, wherein the alkyl group is linear, branched or cyclic, with or without a halogen element or a substituent of $CH_3$;
$R_4$ is a single bond, a substituted or unsubstituted $C_{1-10}$ alkyl group, a $C_{2-10}$ alkenyl group, a $C_{1-10}$ aminoalkyl group, or a $C_{1-10}$ alkoxy group, wherein the alkyl group is linear, branched or cyclic, with or without a halogen element or a substituent of $CH_3$; and
L is 1 or 2,
[Formula 3]

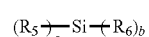

wherein in the formula 3,
$R_5$ is ammonium;
$R_6$ is a halogen element;
a is 2; and
b is 6, and
wherein the composition comprises at least 85% by weight of a combination of sulfuric acid and nitrosylsulfuric acid.

16. The method for preparing an etching composition according to claim 15, further comprising adding 0.1 to 10% by weight of an inorganic acid or a salt thereof, and
 wherein the inorganic acid or a salt thereof is not a fluorine compound, sulfuric acid, or a silicon compound.

* * * * *